US010716241B2

(12) United States Patent
Keisling et al.

(10) Patent No.: US 10,716,241 B2
(45) Date of Patent: Jul. 14, 2020

(54) AIR FLOW DISTRIBUTION SYSTEM FOR DATA CENTER SERVER RACKS

(71) Applicant: INERTECH IP LLC, Danbury, CT (US)

(72) Inventors: Earl Keisling, Ridgefield, CT (US); John Costakis, Hyde Park, NY (US); Gerald McDonnell, Poughquag, NY (US)

(73) Assignee: INERTECH IP LLC, Plano, TX (US)

( * ) Notice: Subject to any disclaimer, the term of this patent is extended or adjusted under 35 U.S.C. 154(b) by 1356 days.

(21) Appl. No.: 14/473,395

(22) Filed: Aug. 29, 2014

(65) Prior Publication Data

US 2015/0181770 A1 Jun. 25, 2015

Related U.S. Application Data

(63) Continuation of application No. PCT/US2013/028475, filed on Feb. 28, 2013.
(Continued)

(51) Int. Cl.
*H05K 7/20* (2006.01)
*F21V 33/00* (2006.01)
*F21W 131/40* (2006.01)

(52) U.S. Cl.
CPC ..... *H05K 7/20745* (2013.01); *F21V 33/0092* (2013.01); *F21W 2131/40* (2013.01)

(58) Field of Classification Search
CPC ... H05K 7/20; F21V 33/0092; F21W 2131/40
(Continued)

(56) References Cited

U.S. PATENT DOCUMENTS

| 1,723,460 A | * | 8/1929 | Beare | F25D 3/04 |
| | | | | 312/116 |
| 1,878,297 A | * | 9/1932 | Seaver | A23L 3/363 |
| | | | | 126/21 A |

(Continued)

FOREIGN PATENT DOCUMENTS

| GB | 2480470 A | 11/2011 |
| WO | 1999063797 A1 | 12/1999 |
| WO | 2010144677 A1 | 12/2010 |

OTHER PUBLICATIONS

International Preliminary Report, Application No. PCT/US2013/028475 dated Sep. 2, 2014.

*Primary Examiner* — Edelmira Bosques
*Assistant Examiner* — Dana K Tighe
(74) *Attorney, Agent, or Firm* — Weber Rosselli & Cannon LLP

(57) ABSTRACT

An air flow distribution system for cooling server racks includes at least one server rack partially defining a hot aisle and a cold aisle, a first air foil disposed above the server rack, and a second air foil disposed above the first air foil. The first air foil and the second air foil are configured to receive air from the hot aisle, and to form turbulent wake patterns in the cold aisle partially defined by the server rack. The air flow distribution system may include a convex ceiling member above the second air foil. A corresponding method includes causing air to be directed between a first air foil disposed above a server rack and a second air foil disposed above the first air foil to form turbulent wake patterns in the cold aisle. An electrical enclosure assembly includes a receptacle and a cover member configured as an air foil.

21 Claims, 13 Drawing Sheets

Related U.S. Application Data

(60) Provisional application No. 61/605,149, filed on Feb. 29, 2012.

(58) Field of Classification Search
USPC .................................................. 454/184, 187
See application file for complete search history.

(56) References Cited

U.S. PATENT DOCUMENTS

| | | | | |
|---|---|---|---|---|
| 2,619,521 A * | 11/1952 | Cuttino | ................... | H01G 2/08 |
| | | | | 174/16.1 |
| 3,037,683 A * | 6/1962 | Sherrill | .................. | B65D 5/701 |
| | | | | 206/264 |
| 3,196,554 A * | 7/1965 | Smith | ..................... | F26B 9/006 |
| | | | | 34/231 |
| 3,234,659 A * | 2/1966 | Smith | ..................... | F26B 21/02 |
| | | | | 236/44 R |
| 3,337,967 A * | 8/1967 | Smith | ..................... | F26B 9/06 |
| | | | | 34/225 |
| 3,403,220 A * | 9/1968 | Riedel | ................. | H02G 3/0431 |
| | | | | 138/162 |
| 3,967,642 A * | 7/1976 | Logsdon | ............... | F24F 11/047 |
| | | | | 137/499 |
| 4,090,434 A * | 5/1978 | Krisko | .................. | F24F 11/047 |
| | | | | 137/890 |
| 4,231,253 A * | 11/1980 | Ohnhaus | ................... | G01F 1/40 |
| | | | | 73/861.62 |
| 4,561,925 A * | 12/1985 | Skerjanec | ............. | B29C 66/861 |
| | | | | 156/379.6 |
| 5,251,654 A * | 10/1993 | Palmer | ................. | B08B 15/023 |
| | | | | 137/501 |
| 5,308,218 A * | 5/1994 | Kobayashi | ............... | B65G 7/06 |
| | | | | 180/125 |
| 5,497,288 A * | 3/1996 | Otis | ................... | H05K 7/20727 |
| | | | | 165/80.3 |
| 5,556,331 A * | 9/1996 | Bastian | ................ | B08B 15/023 |
| | | | | 312/209 |
| 5,692,954 A * | 12/1997 | Lee | .......................... | B08B 5/02 |
| | | | | 454/187 |
| 5,734,552 A * | 3/1998 | Krein | ................... | H01L 23/467 |
| | | | | 165/80.3 |
| 5,969,292 A * | 10/1999 | Snider, Jr. | ............. | H02G 3/0443 |
| | | | | 174/498 |
| 6,365,830 B1 * | 4/2002 | Snider, Jr. | ............. | H02G 3/0456 |
| | | | | 174/484 |
| 6,410,844 B1 * | 6/2002 | Bruner | ................. | H02B 13/025 |
| | | | | 174/17 VA |
| 6,461,233 B1 * | 10/2002 | Gilkison | ............... | B08B 15/023 |
| | | | | 454/56 |
| 6,722,151 B2 * | 4/2004 | Spinazzola | ............... | G06F 1/20 |
| | | | | 62/259.2 |
| 7,365,973 B2 * | 4/2008 | Rasmussen | .......... | H05K 7/2079 |
| | | | | 361/694 |
| 7,430,118 B1 | 9/2008 | Noteboom et al. | | |
| 7,468,084 B2 * | 12/2008 | Bauer | ..................... | F24F 3/161 |
| | | | | 454/187 |
| 7,582,009 B1 * | 9/2009 | Cote | ..................... | F24F 11/047 |
| | | | | 454/264 |
| 7,718,889 B2 * | 5/2010 | Rasmussen | ............. | G06F 1/189 |
| | | | | 174/50 |
| 7,763,800 B2 * | 7/2010 | Lesniak | .................... | H02G 3/30 |
| | | | | 174/480 |
| 8,025,077 B2 * | 9/2011 | Lubawy | .................. | F16K 17/34 |
| | | | | 137/499 |
| 8,184,435 B2 * | 5/2012 | Bean, Jr. | ............ | H05K 7/20745 |
| | | | | 165/104.33 |
| 8,300,410 B2 | 10/2012 | Slessman | | |
| 8,320,125 B1 * | 11/2012 | Hamburgen | ......... | H05K 7/2079 |
| | | | | 165/104.33 |
| D686,999 S * | 7/2013 | Keisling | ...................... | D13/184 |
| 8,628,158 B2 * | 1/2014 | Caveney | ........... | H05K 7/20745 |
| | | | | 312/204 |
| D709,465 S * | 7/2014 | Keisling | ..................... | D13/184 |
| 8,885,335 B2 * | 11/2014 | Magarelli | ............... | G06F 1/206 |
| | | | | 361/679.47 |
| 9,066,450 B2 * | 6/2015 | Bednarcik | ......... | H05K 7/20745 |
| 9,072,200 B2 * | 6/2015 | Dersch | ............... | H05K 7/20745 |
| 9,255,417 B2 * | 2/2016 | Bernard | .................. | E04H 1/005 |
| 9,585,282 B1 * | 2/2017 | Gandhi | ................. | H05K 7/1492 |
| 9,648,784 B2 * | 5/2017 | Keisling | ........... | H05K 7/20609 |
| 2003/0124971 A1 * | 7/2003 | Williams | ................... | G06F 1/20 |
| | | | | 454/184 |
| 2008/0291626 A1 * | 11/2008 | Nelson | .................. | F24F 1/0059 |
| | | | | 361/696 |
| 2009/0241445 A1 * | 10/2009 | Sprague | .................. | E04B 2/827 |
| | | | | 52/243.1 |
| 2010/0307716 A1 * | 12/2010 | Bean, Jr. | ........... | H05K 7/20745 |
| | | | | 165/80.2 |
| 2010/0317278 A1 | 12/2010 | Novick | | |
| 2011/0122570 A1 | 5/2011 | Beck et al. | | |
| 2011/0271610 A1 * | 11/2011 | Cottuli | ............... | H05K 7/20745 |
| | | | | 52/173.1 |
| 2012/0009862 A1 | 1/2012 | Meyer | | |
| 2012/0083196 A1 * | 4/2012 | Mockridge | .......... | F24F 11/0001 |
| | | | | 454/184 |
| 2012/0112612 A1 * | 5/2012 | Krietzman | ......... | H05K 7/20745 |
| | | | | 312/236 |
| 2012/0126572 A1 * | 5/2012 | Hjelm | .................. | B62D 35/001 |
| | | | | 296/180.1 |
| 2013/0300266 A1 * | 11/2013 | Ramey | ............... | A47B 87/0276 |
| | | | | 312/111 |
| 2015/0181770 A1 * | 6/2015 | Keisling | ........... | H05K 7/20745 |
| | | | | 454/184 |
| 2016/0329859 A1 * | 11/2016 | Cap | ........................ | F24J 2/4638 |
| 2018/0058295 A1 * | 3/2018 | Junio | ...................... | B60K 6/26 |
| 2018/0100671 A1 * | 4/2018 | Snider | ..................... | F24F 11/72 |

* cited by examiner

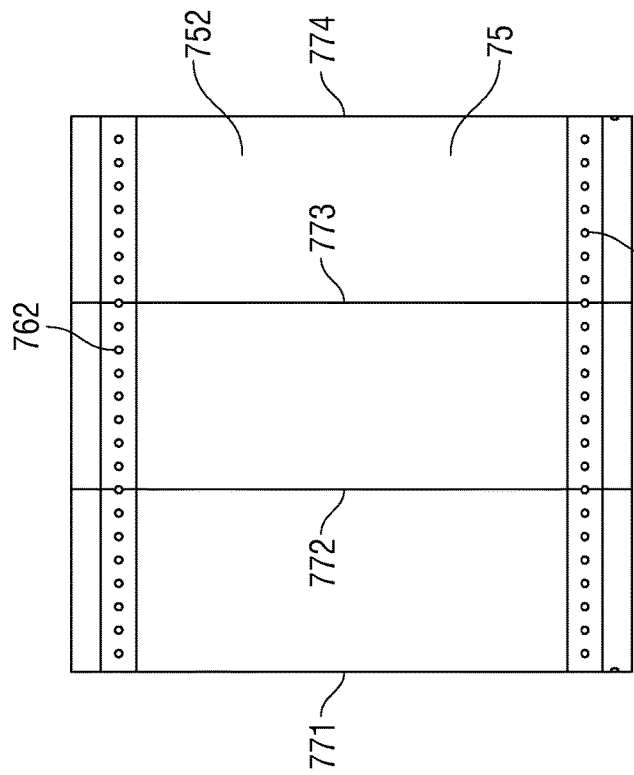
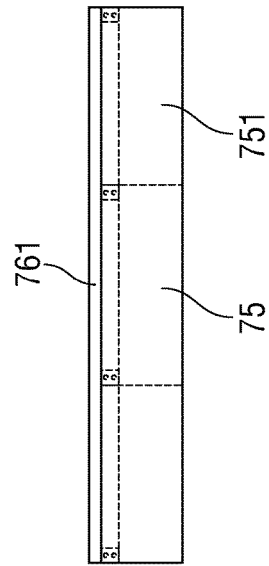
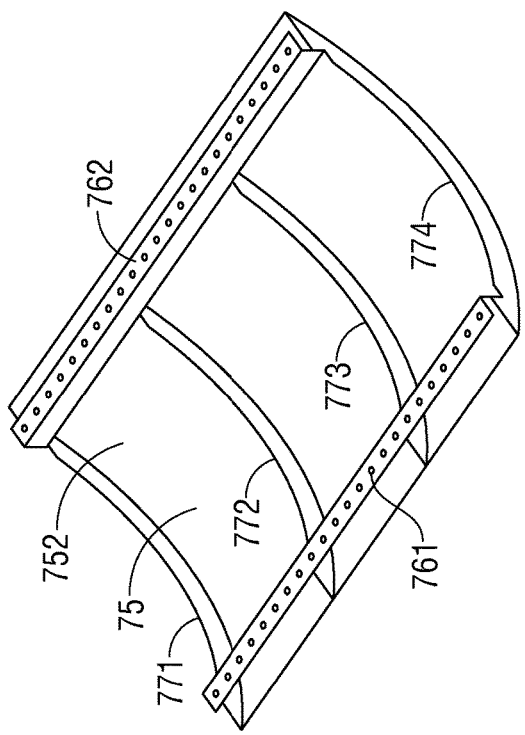
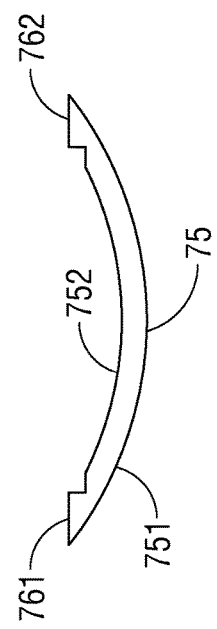
FIG. 11B
FIG. 11D
FIG. 11A
FIG. 11C

AIR FLOW DISTRIBUTION SYSTEM FOR DATA CENTER SERVER RACKS

CROSS-REFERENCE TO RELATED APPLICATIONS

This application is a continuation of International Application No. PCT/US2013/028475 filed on Feb. 28, 2013, which claims priority to U.S. Provisional Patent Application No. 61/605,149 filed on Feb. 29, 2012, the entire contents of each of which are incorporated by reference herein.

BACKGROUND

Due to the generation of large quantities of heat by electronics contained within data center server racks, large amounts of power are consumed for cooling of server racks. A contributing factor to the large power consumption lies in the irregularities in the air flow that cools the server racks.

SUMMARY

The embodiments of the present disclosure are directed to an air flow distribution system for cooling server racks that reduce the power consumption required for cooling of server racks.

More particularly, in one exemplary embodiment, an air flow distribution system for cooling server racks includes at least one server rack partially defining a hot aisle and a cold aisle, a first air foil disposed above the at least one server rack, and a second air foil disposed above the first air foil. The first air foil and the second air foil are configured to receive air from the hot aisle, and to form turbulent wake patterns in the cold aisle partially defined by the at least one server rack. The air flow distribution system may further include a ceiling member disposed above the second air foil. The first air foil, the second air foil, and the ceiling member may be configured to receive air from the hot aisle and to form turbulent wake patterns in the cold aisle partially defined by the at least one server rack.

The air flow distribution system may further include at least one air circulation member that is configured to direct air between the first air foil and the second air foil or between the ceiling member and the first air foil and between the first air foil and the second air foil. The one or more air circulation members may include at least one fan.

In still a further exemplary embodiment, at least a portion of the ceiling member may include a convex surface that interfaces with the air flowing from the hot aisle to the cold aisle. The ceiling member is disposed at least partially downstream of the second air foil.

The first air foil may include a surface that is convex with respect to the air flow, and the second air foil may include a first surface that is concave with respect to the air flow and a second surface that is convex with respect to the air flow.

In yet another exemplary embodiment, the first air foil may be configured and movably coupled to cover an electrical enclosure receptacle configured to receive at least one cable or a support member for the at least one cable for the at least one server rack. The first air foil may be configured to rotatably move to enable access to the at least one cable or a support member for the at least one cable. The cable may include an electrical cable, a fiber-optic cable, or a combination of an electrical cable and a fiber-optic cable.

In yet another exemplary embodiment, the present disclosure relates to a method for distributing air flow for cooling server racks. The method includes disposing at least one server rack at least partially defining a hot aisle and a cold aisle, and causing air to be directed between a first air foil disposed above the at least one server rack and a second air foil disposed above the first air foil. The air exiting from the first air foil and the second air foil form turbulent wake patterns in the cold aisle at least partially defined by the at least one server rack.

In another exemplary embodiment, causing the air to be directed between the first air foil and the second air foil includes causing the air to be directed between a ceiling member disposed above the second air foil and the second air foil, and between the first air foil and the second air foil. The air exiting from the ceiling member, the first air foil, and the second air foil form turbulent wake patterns in the cold aisle partially defined by the at least one server rack. The ceiling member may be configured as a convex surface that interfaces with the air flowing from the hot aisle to the cold aisle, and the method may include causing the air to be directed between the ceiling member configured as a convex surface and the second air foil and between the second air foil and the first air foil, wherein the air exiting from the at least one ceiling member configured as a convex surface, the second air foil, and the first air foil form turbulent wake patterns in the cold aisle partially defined by the at least one server rack.

In one other exemplary embodiment, the first air foil is configured and movably coupled to cover an electrical enclosure receptacle configured to receive at least one cable or a support member for the at least one cable, and the method may include causing the air to be directed between the first air foil that is configured and movably coupled to cover the electrical enclosure receptacle and the second air foil.

In yet another exemplary embodiment, the first air foil is further configured to rotatably move to enable access to the at least one cable or a support member for the at least one cable, and the method may include causing the air to be directed between the first air foil that is configured to rotatably move to enable access to the at least one cable or a support member for the at least one cable and the second air foil. The cable received by the electrical enclosure receptacle may include an electrical cable, a fiber-optic cable, or a combination of an electrical cable and a fiber-optic cable, and the method may include causing the air to be directed between the first air foil that is configured and movably coupled to cover the electrical enclosure receptacle receiving the cable and the second air foil.

In yet another exemplary embodiment, the present disclosure relates to an electrical enclosure assembly for at least one server rack at least partially defining a hot aisle and a cold aisle, that includes an electrical enclosure receptacle configured to receive at least one cable or a support member of the at least one cable, and a cover member movably coupled to cover the electrical enclosure receptacle, the cover member configured as an air foil for air flowing between the hot aisle and the cold aisle.

In yet another exemplary embodiment of the electrical enclosure assembly, the cover member configured as an air foil is a first air foil, and the electrical enclosure assembly may further include a second air foil, wherein the first air foil and the second air foil are configured to form in the cold aisle turbulent wake patterns in the air flowing into the cold aisle. An air circulation member may direct the air flowing between the first air foil and the second air foil. The cover member may be configured to rotatably move to enable access to the at least one cable or a support member of the at least one cable.

In yet another exemplary embodiment, the electrical enclosure assembly may further include a lighting enclosure assembly configured to receive at least one lighting member configured and disposed to project light, wherein at least a portion of the lighting enclosure assembly forms an extension of the air foil. The electrical enclosure assembly may further include at least one lighting member disposed in the lighting enclosure assembly.

BRIEF DESCRIPTION OF THE DRAWINGS

Various embodiments of the present disclosure are described with reference to the accompanying drawings wherein:

FIG. 11A includes a perspective view of the contoured or concave ceiling that is positioned above the cold aisle in FIGS. 6A-7B and 9 above;

FIG. 11B includes an elevation view of the contoured or concave ceiling of FIG. 11A that is positioned above the cold aisle;

FIG. 11C includes another elevation view of the contoured or concave ceiling of FIG. 11A that is positioned above the cold aisle;

FIG. 11D includes another view of the contoured or concave ceiling of FIG. 11A that is positioned above the cold aisle.

DETAILED DESCRIPTION

The present disclosure relates to an air flow distribution system for server racks that significantly reduces the power requirements for cooling server racks within data centers.

Various embodiments of the present disclosure are described with reference to the accompanying drawings as follows.

Figure 1:
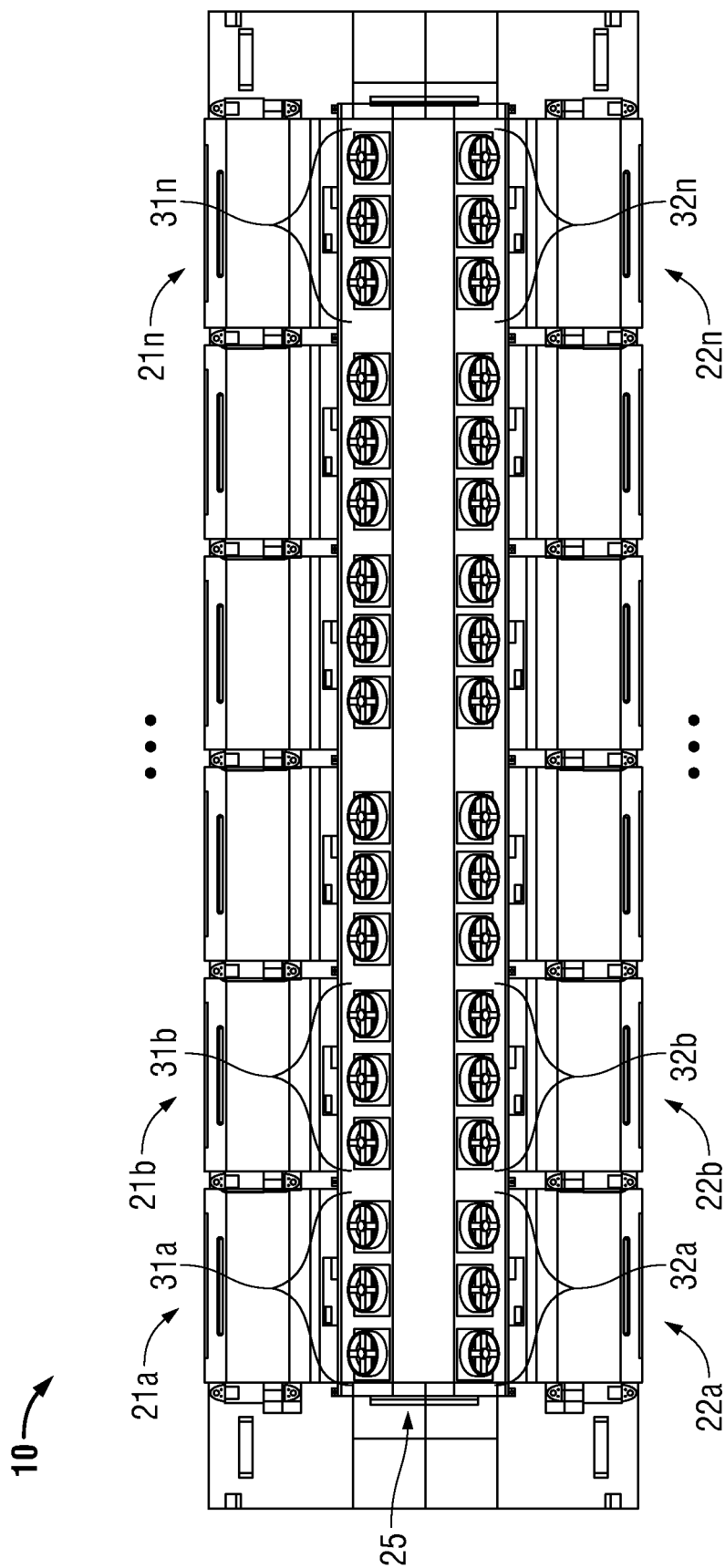
FIG. 1 is a plan view of a portion of a data center subassembly that includes adjacent server racks forming a first side of a central hot aisle and adjacent server racks forming a second side of the central hot aisle.

FIG. 1 is a plan view of a portion of a data center subassembly 10 that includes adjacent server racks 21a, 21b, . . . , 21n forming a first side of a central hot aisle 25 and adjacent server racks 22a, 22b, . . . , 22n forming a second side of the central hot aisle 25.

A set of active air circulation members or forced air circulation members, e.g., three fans 31a, are disposed above server rack 21a and a set of active air circulation members or forced air circulation members, e.g., three fans 32a, are disposed above server racks 22a. Other sets of active circulation members or forced circulation members, e.g., fans, are also correspondingly disposed with the other server racks 21b, . . . , 21n and 22b, . . . , 22n. The fans 31a, 32a are positioned to circulate air in the upward vertical direction to remove heat from the central hot aisle 25.

Figure 2:
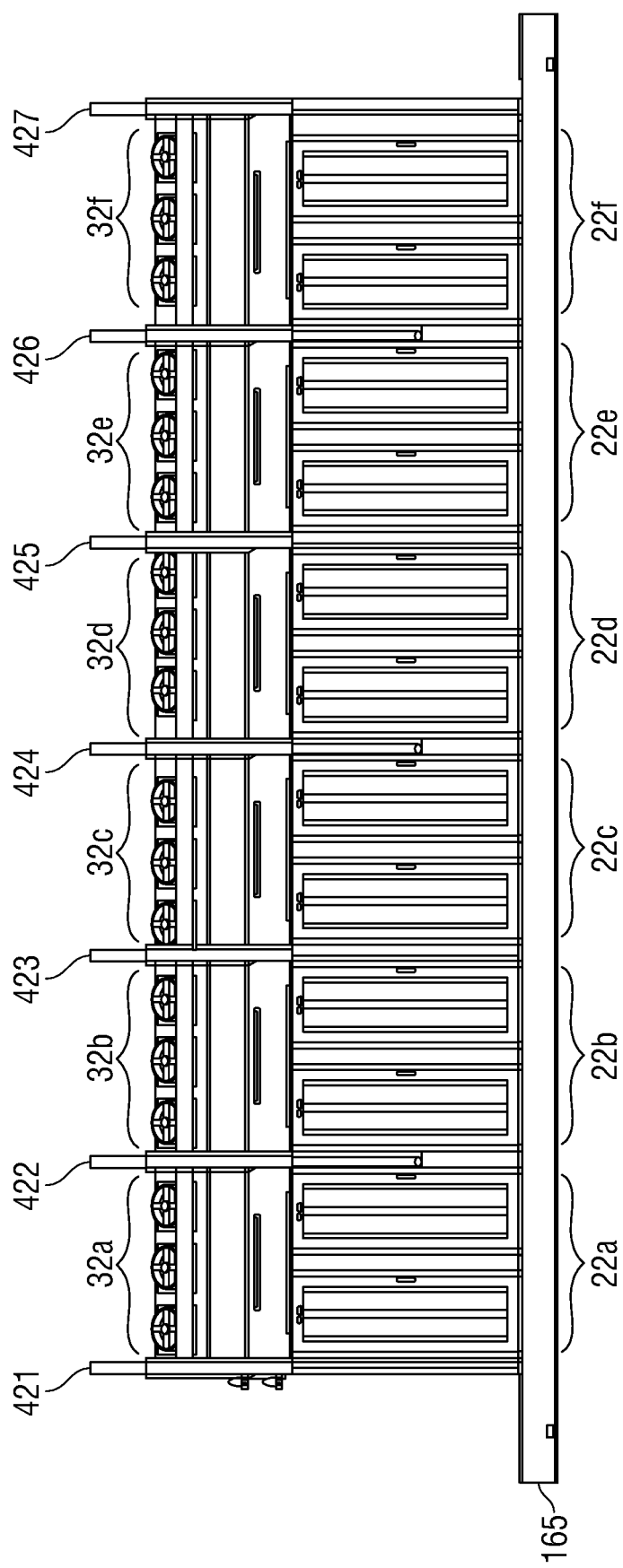
FIG. 2 is an elevation view of a portion of the data center subassembly illustrating sets of three fans above sets of adjacent server racks in which the sets of adjacent server racks are disposed between respective vertical columns.
Figure 3:
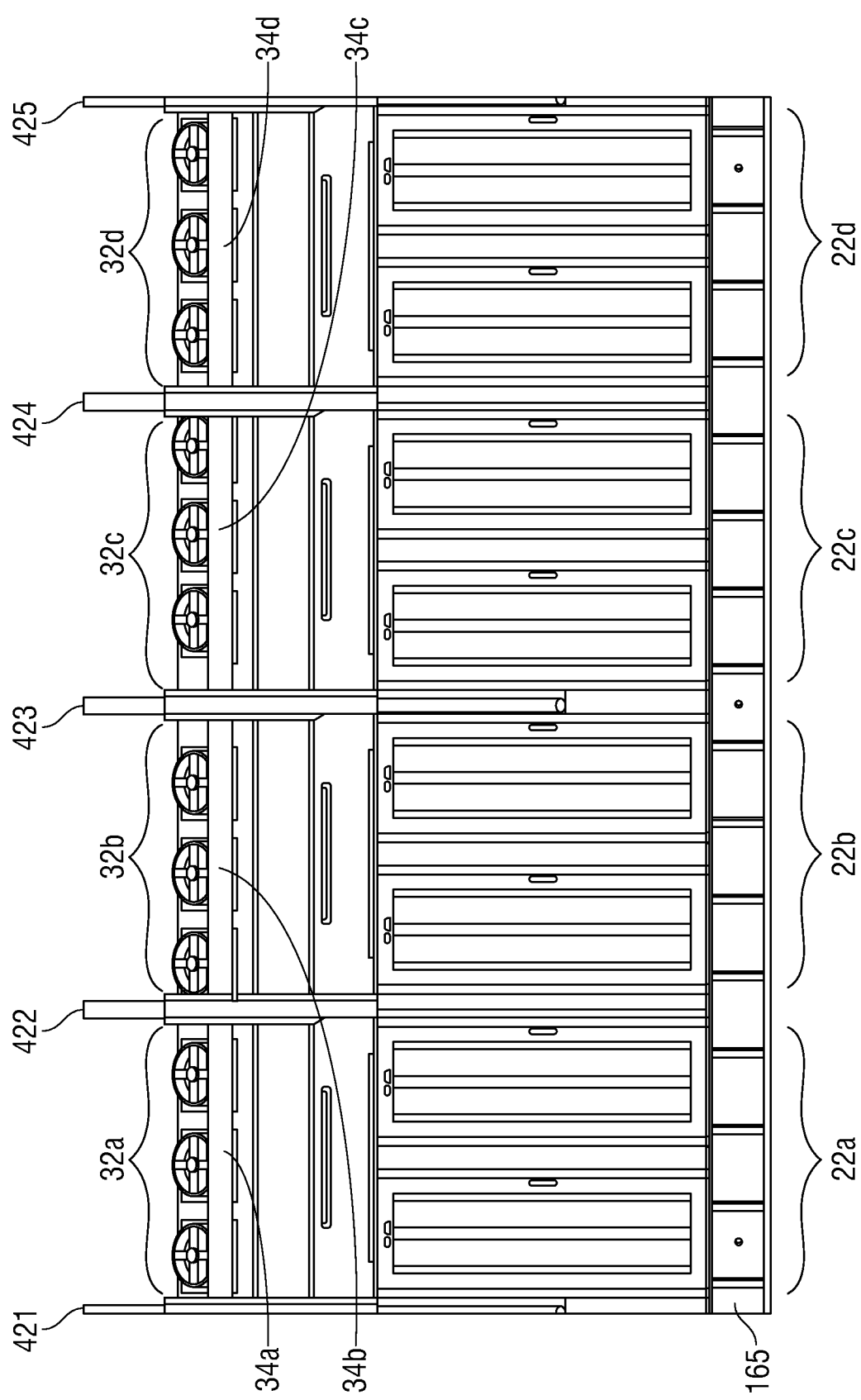
FIG. 3 is a partial view of the elevation view of FIG. 2 of a portion of the data center subassembly illustrating sets of three fans that are positioned above sets of adjacent server racks that are disposed between vertical columns, and partially projecting over upper air foils that are positioned above sets of adjacent server racks according to one exemplary embodiment of the present disclosure.

FIGS. 2 and 3 are elevation views of the portion of the data center subassembly 10 mounted on floor 165 and illustrating sets of active circulation members or forced circulation members, e.g., sets of three fans 32a, 32b, 32c, 32d, 32e, 32f, above sets of adjacent server racks 22a, 22b, 22c, 22d, 22e, 22f, respectively. Sets of adjacent server racks 22a, 22b, 22c, 22d, 22e, 22f are disposed between respective vertical columns 421, 422, 423, 424, 425, 426, 427.

As particularly illustrated in FIG. 3, the sets of three fans 32a, 32b, 32c, 32d partially project over upper air foil 34a, 34b, 34c, 34d that are positioned above sets of adjacent server racks 22a, 22b, 22c, 22d, respectively.

Figure 4:
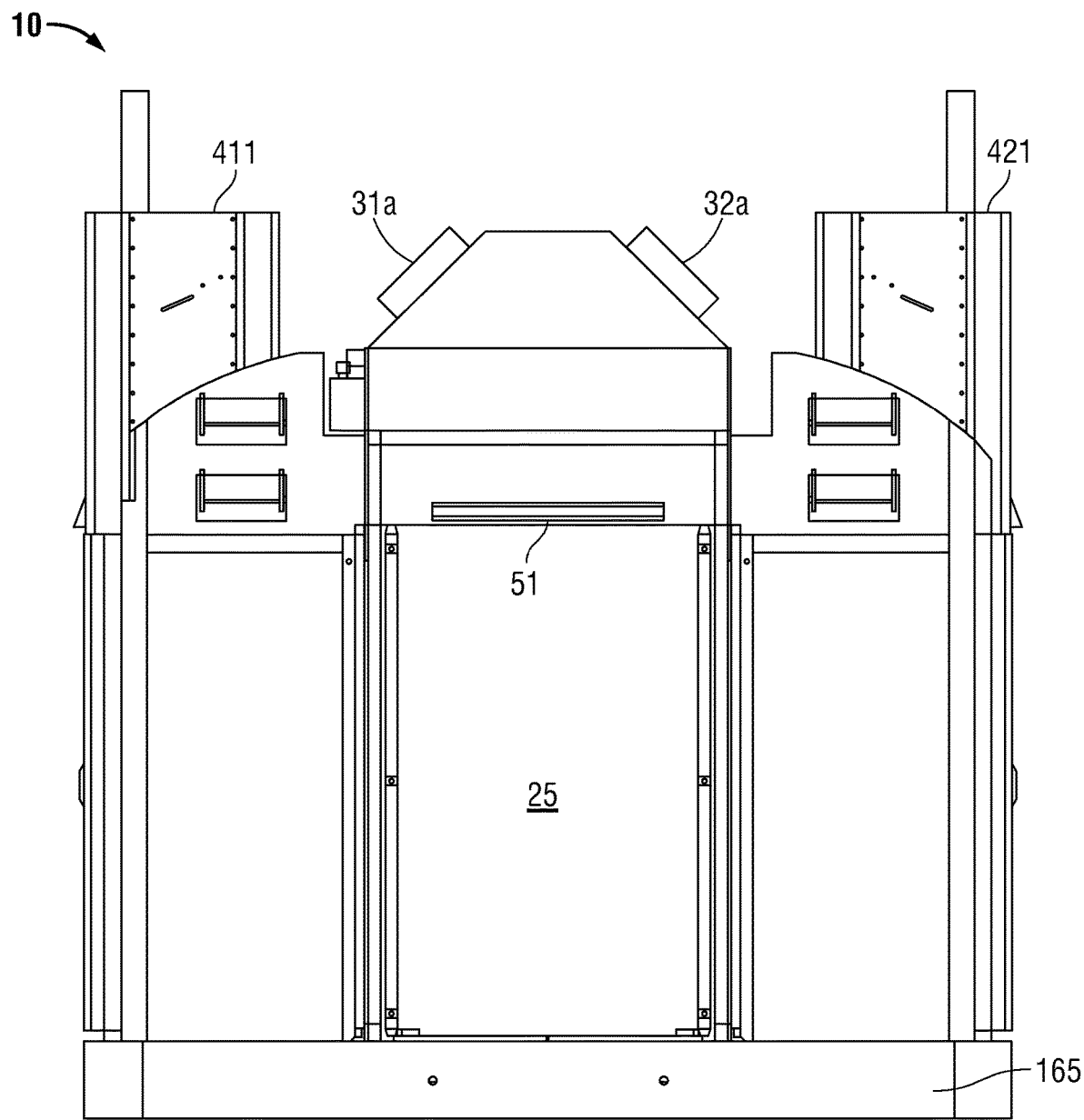
FIG. 4 is an end elevation view of the portion of the data center subassembly of FIGS. 1, 2, and 3 showing a central hot aisle having a common fan enclosure above the hot aisle.

FIG. 4 is an end elevation view of the portion of the data center subassembly 10 showing the central hot aisle 25 having a common fan enclosure 51 above the hot aisle 25.

Opposing vertical columns 411 and 421 are disposed on opposite sides of the hot aisle 25. The sets of server racks 21*a*, . . . , 21*e* and 22*a*, . . . , 22*e* at least partially define the hot aisle 25.

Figure 5:
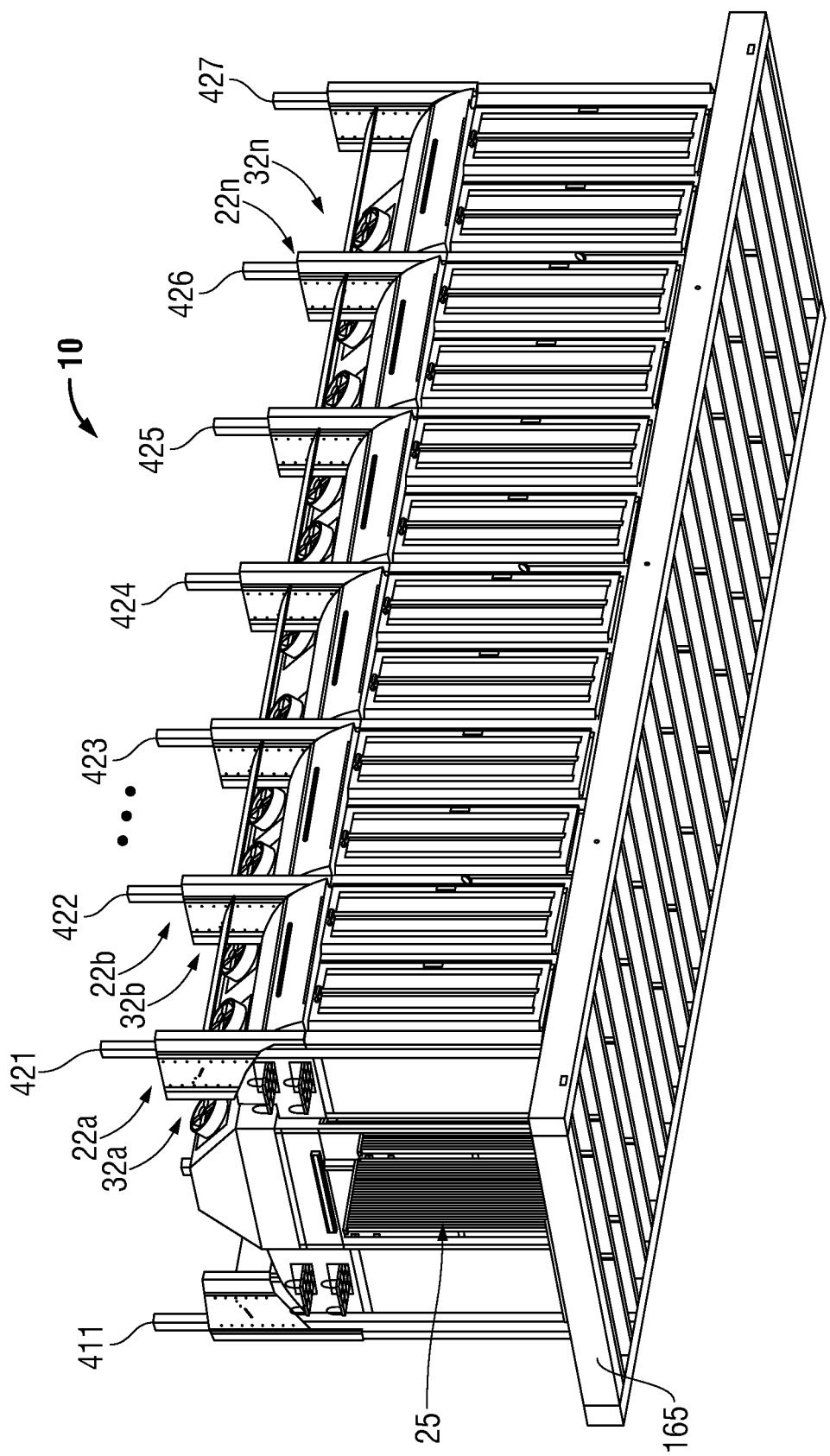
FIG. 5 is a perspective view looking at the portion of the data center subassembly of FIGS. 1-4 from below.

FIG. 5 is a perspective view looking at the portion of the data center subassembly 10 of FIGS. 1-4 from below illustrating the data center subassembly 10 mounted on floor 165.

Figure 6B:
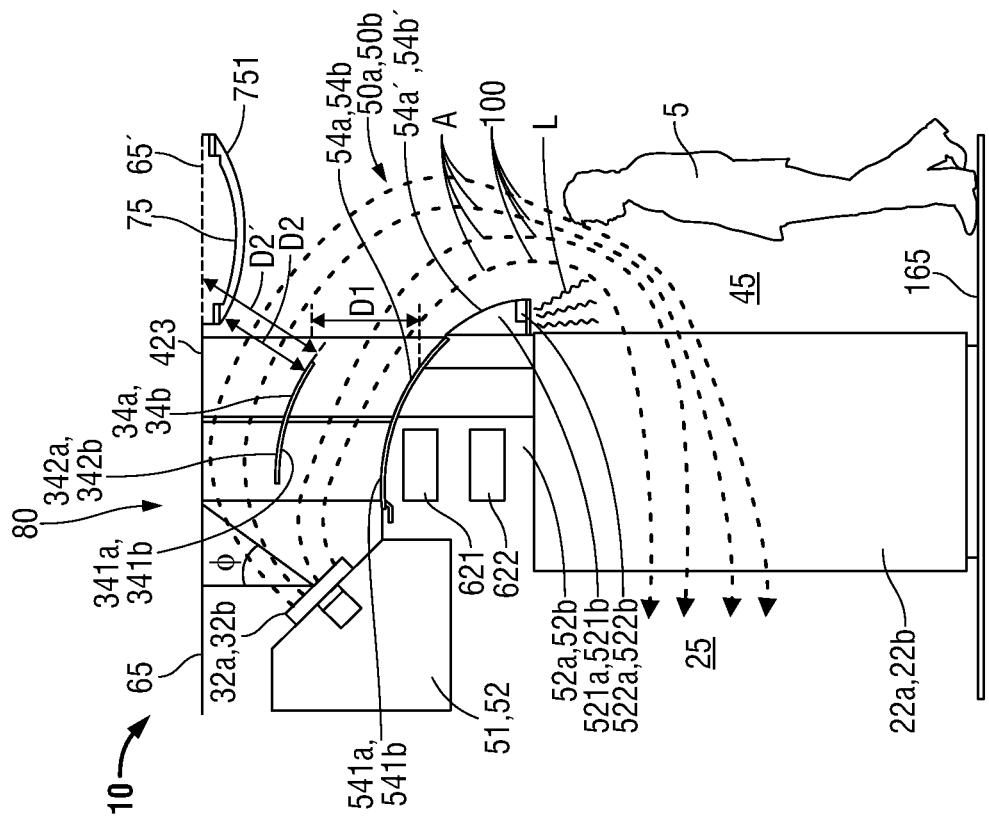
FIG. 6B is an end elevation view of FIG. 6A and illustrates a contoured concave ceiling of the central cold aisle to form turbulent wake patterns in the central cold aisle for more efficient cooling of the sets of server racks according to exemplary embodiments of the present disclosure.
Figure 6A:
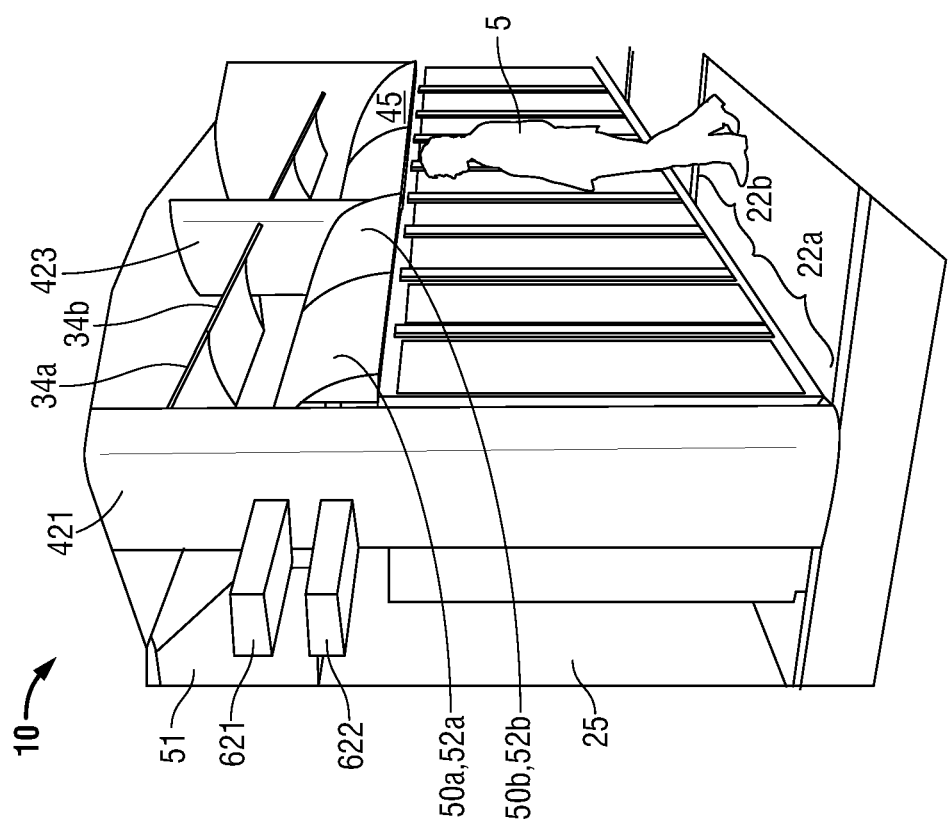
FIG. 6A is a perspective view of the portion of the data center subassembly illustrating a cold aisle opposite the central hot aisle and light boxes that include covers that also serve as lower air foils with respect to upper air foils.

FIGS. 6A and 6B illustrate the portion of the data center subassembly 10 (with column 422 omitted) and a cold aisle 45 opposite central hot aisle 25 with a person 5 standing in the cold aisle to illustrate one embodiment of the height of the sets of server racks 22*a*, 22*b*. The sets of server racks 22*a*, 22*b* . . . at least partially define the hot aisle 25 and the cold aisle 45. Electrical enclosure assemblies 50*a* and 50*b* include electrical enclosure receptacles or light and cable tray boxes 52*a*, 52*b*, and are disposed immediately above adjacent sets of server racks 22*a*, 22*b*, respectively. The light and cable tray boxes 52*a*, 52*b* include cable support members, e.g., upper cable tray 621 and lower cable tray 622. The upper cable tray 621 and lower cable tray 622 support cables that may carry electricity and/or data to and/or from the sets of server racks 22*a*, 22*b* . . . . The cables may include electrically conductive cables, fiber-optic cables, or other types of cables for conveying power, control signals, data, and the like.

As illustrated in FIGS. 8 and 10A-10E, in conjunction with FIGS. 6A and 6B, the electrical enclosure assemblies 50*a*, 50*b* include electrical enclosure receptacles or light and cable tray boxes 52*a*, 52*b* and covers 54*a*, 54*b*, respectively, for the electrical enclosure receptacles or light and cable tray boxes 52*a*, 52*b* that also serve as first or lower air foils with respect to second or upper air foils 34*a*, 34*b*. That is, upper air foils 34*a* and 34*b* are positioned at a suitable distance D1 above lower air foils 54*a* and 54*b*, respectively.

The first or lower air foils or covers 54*a*, 54*b* are configured and movably coupled to cover the electrical enclosure receptacles 52*a*, 52*b* (see FIGS. 10A-10E) that are configured to receive cables 6211, 6222 (see FIG. 8) or a support member, e.g., cable trays 621, 622, respectively (see FIG. 8), for the cables 6211, 6222 for the sets of one or more server racks 22*a* or 22*b*. The cables 6211, 6222 may include an electrical cable, a fiber-optic cable, or a combination of an electrical cable and a fiber-optic cable. The sets of three fans 32*a*, 32*b* are positioned to exhaust cold air from the common fan enclosure 51 at an angle Φ1 with respect to the vertical of approximately 45 degrees towards a ceiling member 65 above the adjacent sets of server racks 22*a*, 22*b*.

The cold aisle 45 includes a contoured or convex ceiling member 75 extending at least partially along the cold aisle 45. The contoured or convex ceiling member 75 is disposed a distance D2 from the upper air foils 34*a*, 34*b* such that a portion of the cold air flowing from the sets of three fans 32*a*, 32*b* is deflected downwardly into the cold aisle 45 by the contoured or convex ceiling member 75 and the upper air foils 34*a*, 34*b*, as indicated by the arrows A. The distance D2 defines the dimension of an effective nozzle throat defined by the upper air foils 34*a*, 34*b* and the contoured or convex ceiling member 75. The ceiling member 75 thus includes a convex surface 751 that interfaces with the air indicated by arrows A flowing from the hot aisle 25 to the cold aisle 45. The ceiling member 75 is disposed at least partially downstream of the upper air foils 34*a*, 34*b*.

Another portion of the cold air flowing from the sets of three fans 32*a*, 32*b* is deflected downwardly into the cold aisle 45 by the upper air foils 34*a*, 34*b* and the lower air foils 54*a*, 54*b* through the area defined by the distance D1.

As can be appreciated by the foregoing, the first or lower air foils 54*a*, 54*b* include surfaces 541*a*, 541*b* that are convex with respect to the air flow indicated by the arrows A. The second or upper air foils 34*a*, 34*b* include first surfaces 341*a*, 341*b* that are concave with respect to the air flow indicated by the arrows A and concave with respect to the surfaces 541*a*, 541*b* of the lower air foils 54*a*, 54*b* that are convex with respect to the air flow indicated by the arrows A. The second or upper air foils 34*a*, 34*b* include second surfaces 342*a*, 342*b* that are convex with respect to the air flow indicated by the arrows A.

In conjunction with the electrical enclosure assemblies 50*a*, 50*b*, the electrical enclosure assemblies 50*a*, 50*b* each may further include lighting enclosure assemblies 521*a*, 521*b* that are configured to receive at least one lighting member 522*a*, 522*b*, respectively, that is configured and disposed to project light L, wherein at least a portion of the lighting enclosure assemblies 521*a*, 521*b* forms an extension 54*a*′, 54*b*′ of the first air foils or covers 54*a*, 54*b*. The lighting enclosure assemblies 521*a*, 521*b* may each further include at least one lighting member 522*a*, 522*b* disposed in the lighting enclosure assemblies 521*a*, 521*b*, respectively.

The light L may project vertically downward toward the floor 165 supporting the sets of one or more server racks 22*a*, 22*b*. In one exemplary embodiment, the electrical enclosure assemblies 50*a*, 50*b* may further include the second or upper air foils 34*a*, 34*b* (in conjunction with support of the second or upper air foils 34*a*, 34*b* by at least one of the vertical columns, e.g., column 421 or column 423 or both). Due to the forced flow of the air from the contoured or convex ceiling member 75, the upper air foils 34*a*, 34*b* and the lower air foils 54*a*, 54*b*, both portions of the air flowing therefrom are formed into turbulent wake patterns 100 in the cold aisle 45.

The formation of the turbulent wake patterns 100 results in enhanced, more efficient cooling of the sets of server racks 22*a*, 22*b*. Increases or decreases in the strength or occurrence of the turbulent wake patterns 100 may be controlled by varying the operating speed of at least one fan in the sets of three fans 32*a*, 32*b*. Consequently, the first or lower air foils, which also serve as covers, 54*a*, 54*b*, the second or upper air foils 34*a*, 34*b*, and the contoured or convex ceiling members 75 are aerodynamically designed to create the turbulent wake patterns 100.

Thus, an air flow distribution system 80 for cooling of the sets of server racks, e.g., server racks 22*a*, 22*b*, is defined by at least one server rack, e.g., server racks 22*a*, 22*b*, at least partially defining hot aisle 25 and cold aisle 45, a first air foil, e.g., lower air foils 54*a*, 54*b*, disposed above the one or more server racks 22*a*, 22*b*, and a second air foil, e.g., upper air foils 34*a*, 34*b*, disposed above the first air foil, e.g., lower air foils 54*a*, 54*b*, wherein the first air foil 54*a* and/or 54*b* and the second air foil 34*a* and/or 34*b* are configured to receive the air indicated by arrows A from the hot aisle 25, and to form turbulent wake patterns 100 in the cold aisle 45 partially defined by the one or more sets of server racks, e.g., 22*a* and 22*b*.

The air flow distribution system 80 may further include at least one active circulation member or forced circulation member, e.g., the sets of three fans 32*a*, 32*b*, the ceiling member 65, the contoured or convex ceiling member 75, at least one of the second or upper air foils 34*a*, 34*b*, and at least one of the first or lower air foils 54*a*, 54*b*, such that the configurations and geometrical relationships between these components cause the formation of the turbulent wake patterns 100 in the cold aisle 45 as described herein.

In one exemplary embodiment of the air flow distribution system 80, the cold aisle 45 includes a planar or flat surface such as ceiling member 65' extending at least partially along the cold aisle 45, as illustrated by the dashed line in FIG. 6B, as opposed to the contoured or convex ceiling member 75. The planar or flat surface ceiling member 65' is disposed a distance D2' from the upper air foils 34a, 34b such that a portion of the cold air flowing from the sets of active circulation members, e.g., three fans 32a, 32b, is deflected downwardly into the cold aisle 45 by the planar or flat surface ceiling 65' and the upper air foils 34a, 34b. The distance D2' defines the diameter of an effective nozzle throat defined by the upper air foils 34a, 34b and the planar or flat surface ceiling 65'.

Figure 7B:
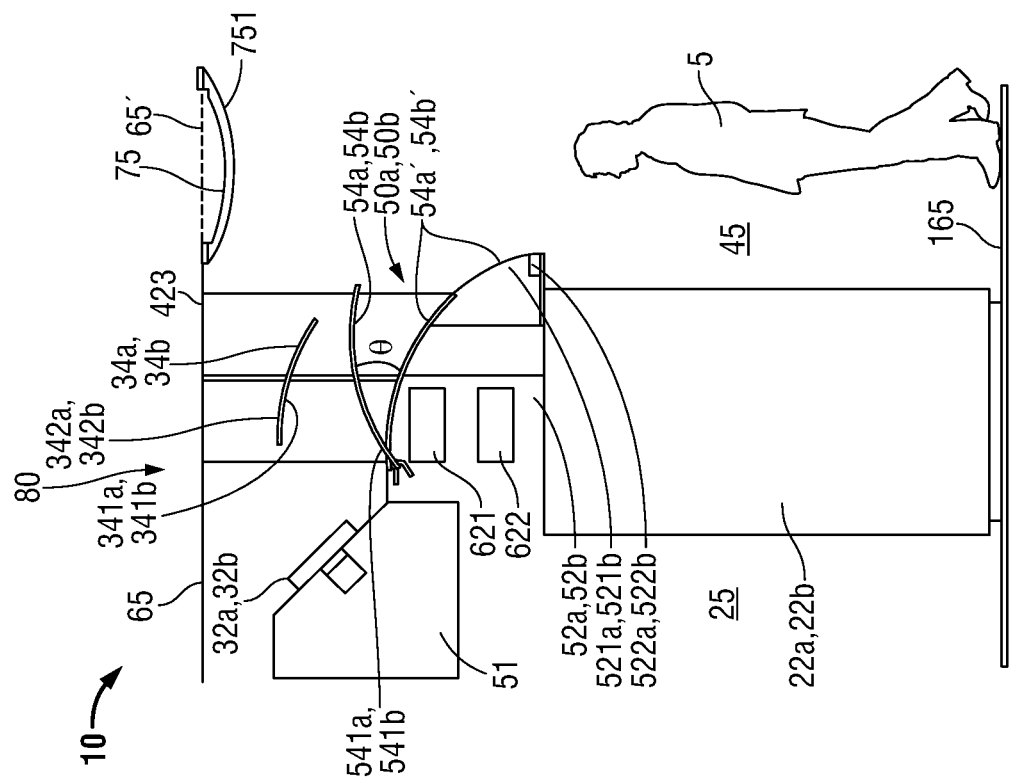
FIG. 7B is an end elevation view of the portion of the data center subassembly of FIG. 7A showing the air foils, which also serve as light box covers, hinged up at an angle to allow access to the cable trays.
Figure 7A:
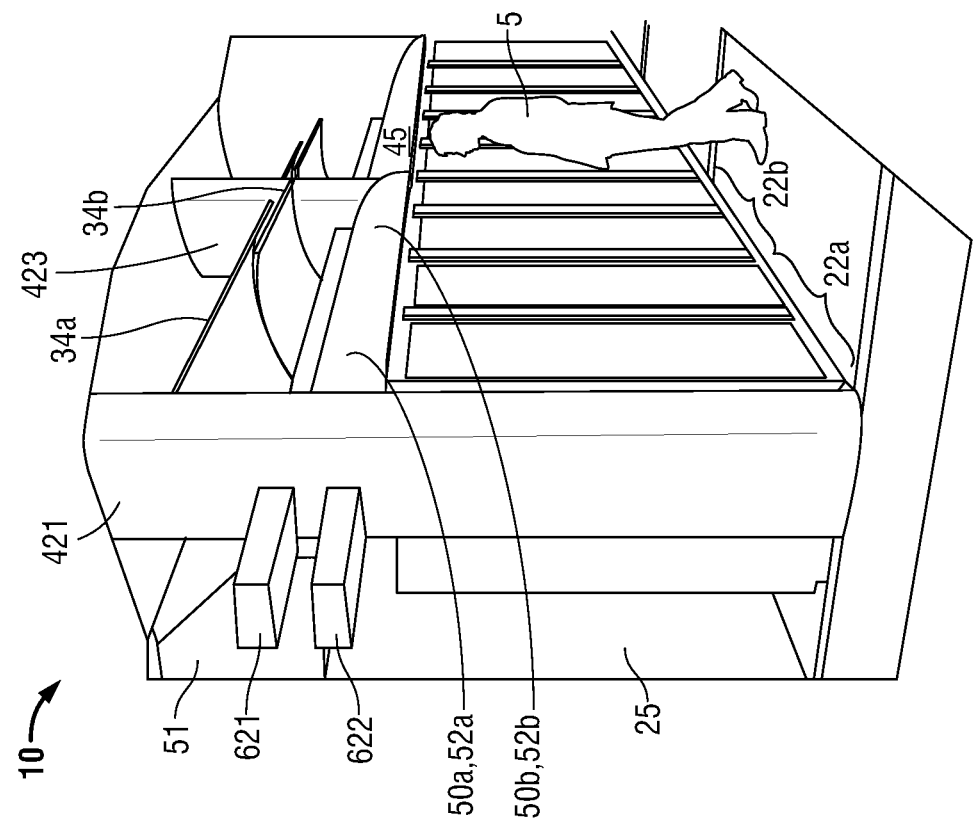
FIG. 7A is a perspective view of the portion of the data center subassembly of FIGS. 6A and 6B showing the air foils, which also serve as light box covers, hinged up at an angle to allow access to the cable trays.

FIGS. 7A and 7B illustrate the portion of the data center subassembly 10 of FIGS. 6A and 6B showing the electrical equipment enclosures or light and cable tray boxes 52a, 52b and the air foils 54a, 54b, which also serve as light box covers, hinged up at an angle θ of about 35 degrees (with respect to the initial position of the air foils 54a, 54b as illustrated in FIG. 6B) to allow access to the cable trays 621, 622. Thus, the first air foils 54a, 54b are configured to rotatably move to enable access to the one or more cables 6211, 6222 or the support members, e.g., cable trays 621, 622, of the one or more cables 6211, 6222, respectively.

Figure 8:
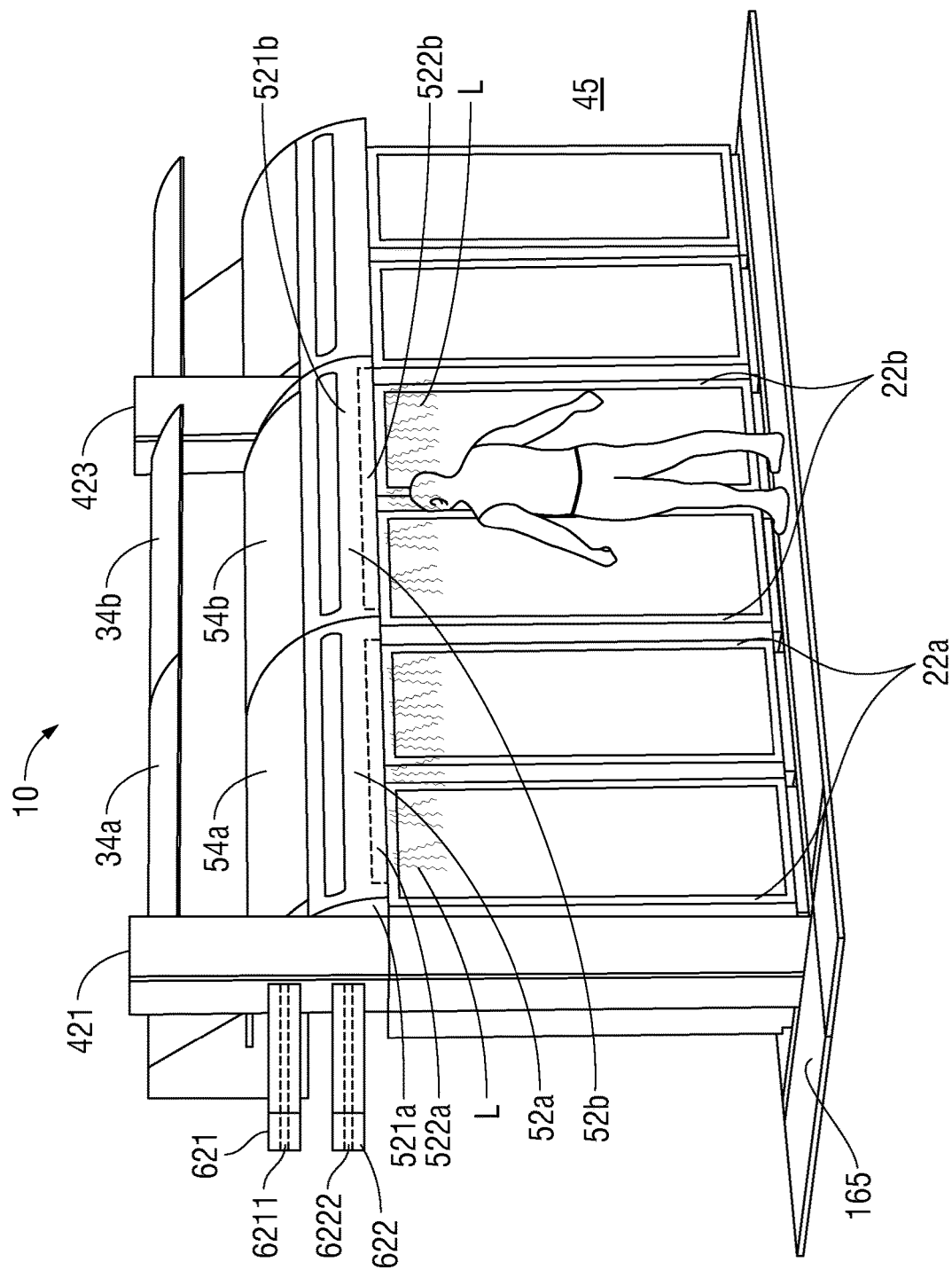
FIG. 8 is a perspective view of the cold aisle of FIGS. 6A, 6B, 7A, 7B with the person positioned to illustrate an exemplary height of the sets of server racks and the elevation of the air foils above the light boxes.

FIG. 8 is a perspective view of the cold aisle 45 of FIGS. 6A-7B with the person 5 positioned to illustrate an exemplary height of the sets of server racks 22a, 22b.

As described above with respect to FIG. 6B, FIG. 8 also illustrates that the first or lower air foils or covers 54a, 54b are configured and movably coupled to cover an electrical enclosure receptacle 52a or 52b (see FIGS. 10A-10E) that is configured to receive cables 6211, 6222 or a support member, e.g., cable trays 621, 622, respectively, of the cables 6211, 6222 for the sets of one or more server racks 22a, 22b. The cables 6211, 6222 may include an electrical cable, a fiber-optic cable, or a combination of an electrical cable and a fiber-optic cable.

Additionally, FIG. 8 also illustrates the electrical enclosure assemblies 50a, 50b, each of which may further include lighting enclosure assemblies 521a, 521b that are configured to receive at least one lighting member 522a, 522b, respectively, that is configured and disposed to project light L, wherein at least a portion of the lighting enclosure assemblies 521a, 521b forms an extension 54a', 54b' of the first air foils or covers 54a, 54b. As previously described, the lighting enclosure assemblies 521a, 521b may each further include at least one lighting member 522a, 522b disposed in the lighting enclosure assemblies 521a, 521b, respectively. The light L may project vertically downward toward the floor 165 supporting the sets of one or more server racks 22a, 22b. The lighting members 522a, 522b may be, for example, linear light-emitting diodes (LED) such as a Model S-Line S1200 manufactured by Integrated Illumination Systems, Inc. of Morris, Conn., USA.

Figure 9:
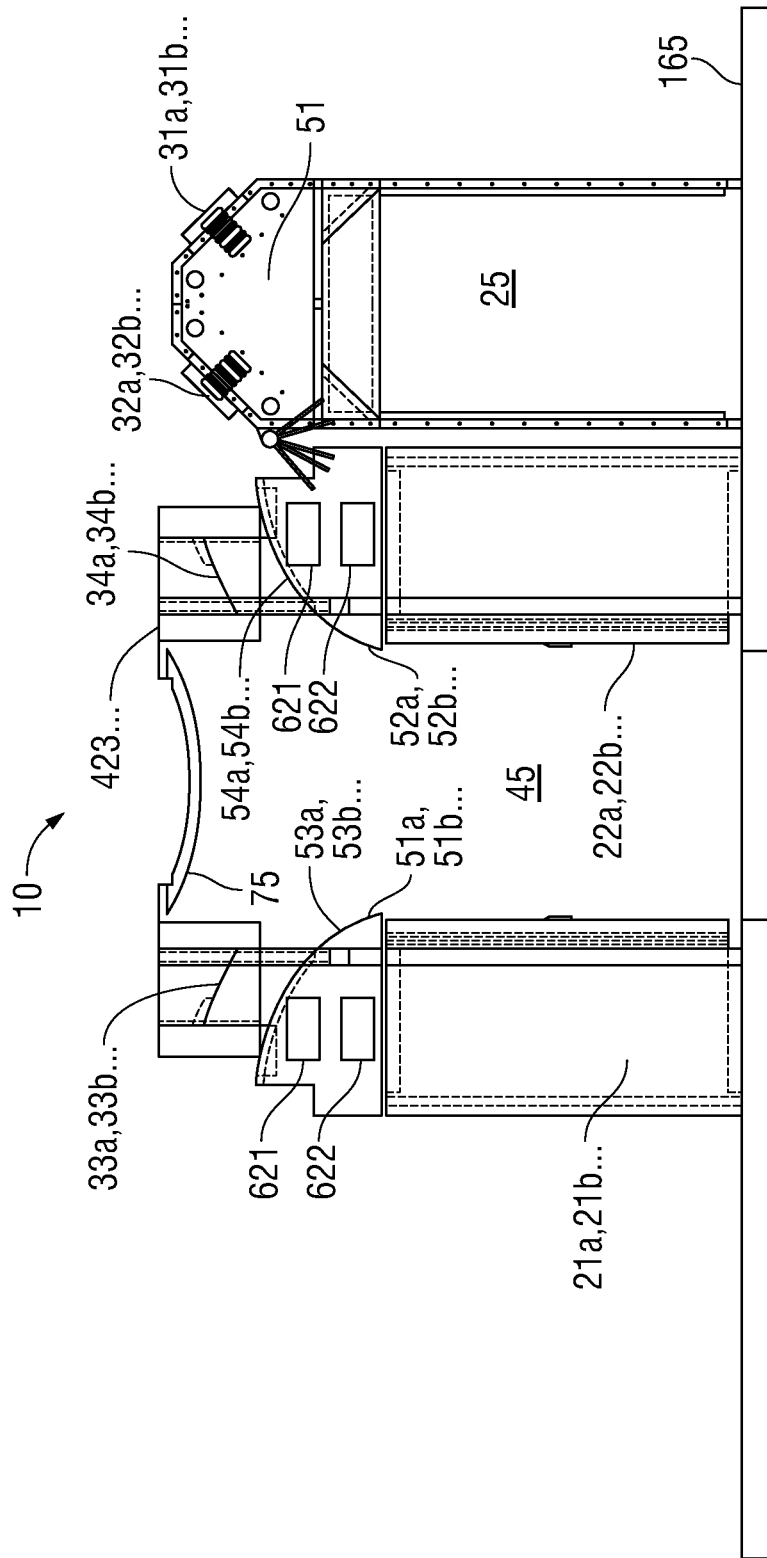
FIG. 9 is an end elevation view of the portion of the data center subassembly of FIGS. 6A-8 illustrating the hot aisle opposite the central cold aisle and light boxes that include covers that also serve as lower air foils with respect to upper air foils and a contoured concave ceiling of the central cold aisle to form turbulent wake patterns in the central cold aisle for more efficient cooling of the sets of server racks according to exemplary embodiments of the present disclosure.
Figure 10A:
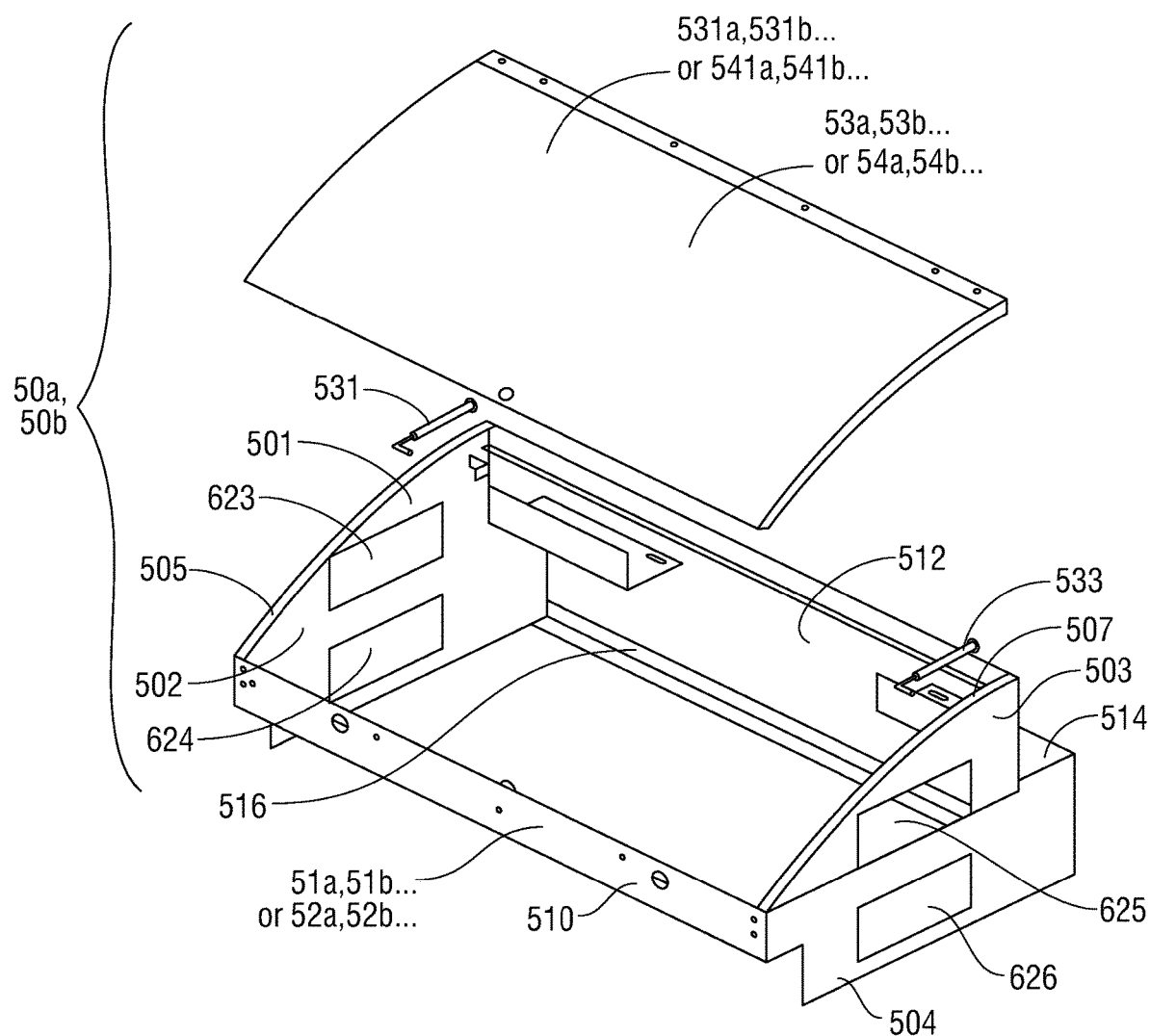
FIG. 10A includes an exploded perspective view of the electrical light and cable tray box and the dual purpose cover and lower air foil according to one exemplary embodiment of the present disclosure.
Figure 10C:
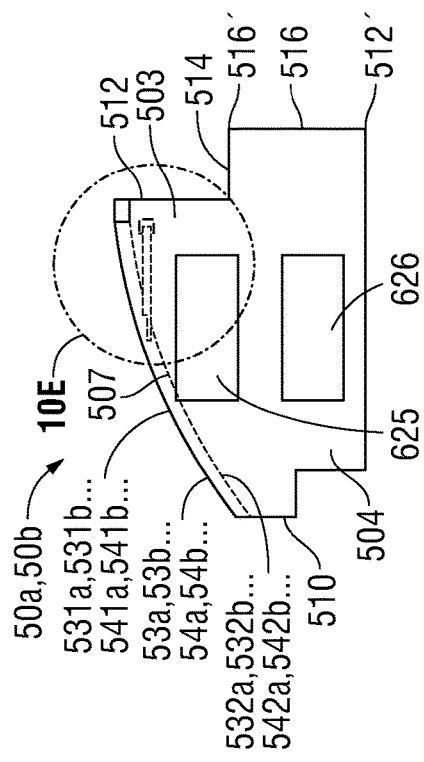
FIG. 10C includes another elevation view of the electrical light and cable tray boxes and the dual purpose covers and lower air foils according to FIG. 10A.
Figure 10E:
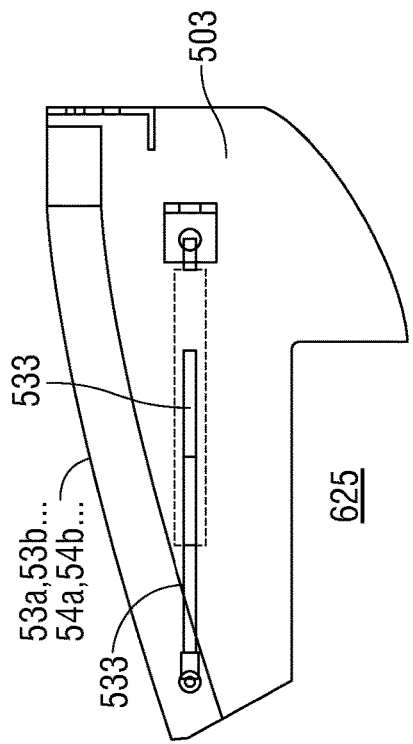
FIG. 10E is a detailed view of an extendable strut member illustrated in FIG. 10E.
Figure 10B:
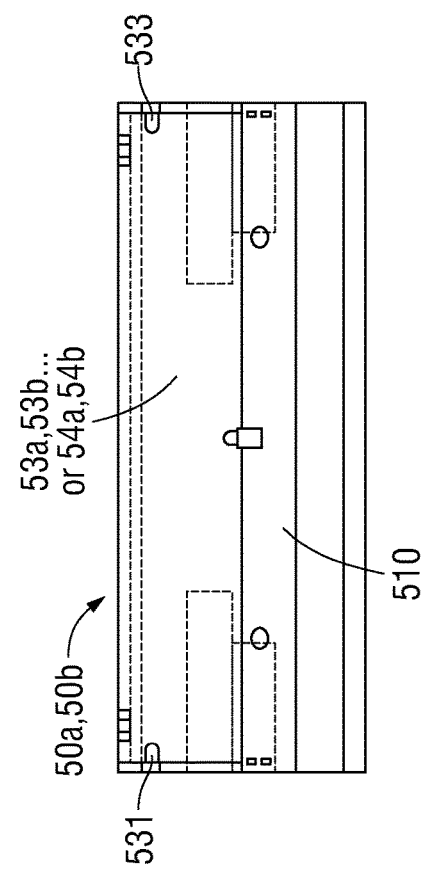
FIG. 10B includes an elevation view proximal to a user of the electrical light and cable tray boxes and the covers, which also server as lower air foils according to FIG. 10A.
Figure 10D:
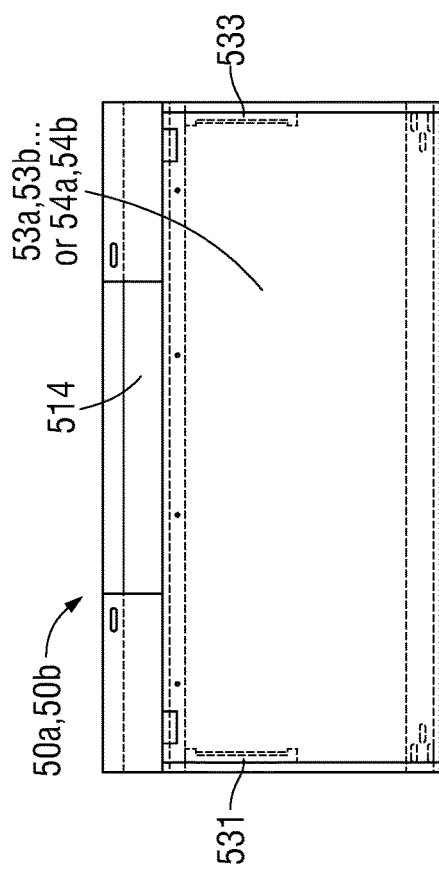
FIG. 10D includes another view of the electrical light and cable tray boxes and the dual purpose covers and lower air foils according to FIG. 10A.

FIG. 9 is another end elevation view of the portion of the data center subassembly 10 showing light and cable tray boxes 51a, 51b, . . . disposed immediately above adjacent sets of server racks 21a, 21b, . . . , respectively. Upper air foils 33a, 33b are suitably positioned with respect to lower air foils 53a, 53b, . . . and upper air foils 34a, 34b, . . . are suitably positioned with respect to lower air foils 54a, 54b, . . . to cause the turbulent flow in cold aisle 45 as described herein. The contoured or convex ceiling member 75 is also positioned with respect to the upper air foils 33a, 33b, . . . to cause the turbulent flow in cold aisle 45 as described herein.

FIGS. 10A-10E include an exploded perspective view (FIG. 10A) and orthogonal views (FIGS. 10B, 10C, 10D and 10E) of the electrical enclosure assemblies 50a, 50b that include the electrical enclosure receptacles, e.g., light and cable tray boxes 51a, 51b, . . . , 52a, 52b, . . . , and the dual purpose covers and lower air foils 53a, 53b, . . . , 54a, 54b . . . .

More particularly, FIGS. 10A-10E illustrate the dual purpose covers and lower air foils 53a, 53b, . . . , 54a, 54b . . . positioned above the light and cable tray boxes 51a, 51b, . . . , 52a, 52b, . . . . The light and cable tray boxes 51a, 51b, . . . , 52a, 52b, . . . include a first upper lateral wall 501 and a second upper lateral wall 503 positioned parallel to the first upper lateral wall 501. The light and cable tray boxes 51a, 51b, . . . , 52a, 52b, . . . further include transverse brace member 510 proximal to a user and upper rear panel member 512 distal to a user. The first upper lateral wall 501 and the second upper lateral wall 503 are each orthogonally joined to the upper rear panel member 512.

Both the first upper lateral wall 501 and the second upper lateral wall 503 are each defined by a partially curved wedge-shaped convex profile 505 and 507, respectively, that is configured to mesh with surfaces 542a, 542b (or 532a, 532b) on sides of the first or lower air foils 54a, 54b (or 53a, 53b) that are opposite to surfaces 541a, 541b (or 531a, 531b) that are convex with respect to the air flow as described herein with respect to FIG. 6B. The transverse brace member 510 supports the first upper lateral wall 501 and the second upper lateral wall 503 at the respective tips of the partially curved wedge-shaped convex profile 505 and 507.

The electrical enclosure receptacles, e.g., light and cable tray boxes 51a, 51b, . . . , 52a, 52b, . . . , also include first lower lateral wall 502 and second lower lateral wall 504 that are each orthogonally joined to a lower rear panel member 516 that is distal to a user. The first lower lateral wall 502 and second lower lateral wall 504 are joined at proximal ends by the transverse brace member 510.

The electrical enclosure receptacles, e.g., light and cable tray boxes 51a, 51b, . . . , 52a, 52b, . . . , are also configured such that the lower rear panel member 516 projects distally from the upper rear panel member 512 and the lower transverse edge 512' of the upper rear panel member 512 is joined to the upper transverse edge 516' of the lower rear panel member 516 by a transverse panel member 514.

The first upper lateral wall 501 and the second upper lateral wall 503 each include rectangularly-shaped apertures 623 and 625, respectively, that are each configured to receive and support cable support member or upper cable tray 621. Correspondingly, the first lower lateral wall 502 and the second lower lateral wall 504 each include rectangularly-shaped apertures 624 and 626, respectively, that are each configured to receive and support cable support member or lower cable tray 622.

Thus, the surfaces 542a, 542b of the lower air foils 54a, 54b define a concave profile that meshes with the partially curved wedge-shaped convex profiles 505 and 507 of the first and second lateral walls 501 and 503, respectively.

Referring again to FIG. 10E, the lower air foils 54a, 54b also serve as covers for the electrical enclosure receptacles, e.g., light and cable tray boxes 51a, 51b, . . . , 52a, 52b, . . . . The covers or lower air foils 54a, 54b are joined to the first upper lateral wall 501 and the second upper lateral wall 503 via extendable strut members 531 and 533, respectively. The extendable strut members 531 and 533 enable the covers or lower air foils 54a, 54b to be elevated or hinged up at the angle θ of about 35 degrees (with respect to the initial position of the air foils 54a, 54b as illustrated in FIG.

6B), as described above with respect to FIGS. 7A and 7B, to allow access to the cable trays 621, 622.

FIGS. 11A-11B include a perspective view (see FIG. 11A) and orthogonal views (see FIGS. 11B, 11C, and 11D) of the contoured or convex ceiling member 75 that is positioned above the cold aisle 45 in FIGS. 6A, 6B, 7A, 7B, and 9 above. The contoured or convex ceiling member 75 includes the convex surface 751 that interfaces with the air indicated by arrows A flowing from the hot aisle 25 to the cold aisle 45, as described above with respect to FIG. 6B. On the side opposite to the convex surface 751, the contoured or convex ceiling member 75 includes a concave surface 752. The concave surface 752 includes first and second parallel lateral strips 761 and 762, respectively, that enable attachment of the contoured or convex ceiling member 75 to the ceiling member 65 or to ceiling member 65'. The contoured or convex ceiling member 75 may further include contoured reinforcing rib members 771, 772, 773, 774 that are disposed transversely to bridge the lateral distance between the first and second parallel lateral strips 761 and 762 and are configured to mesh with the concave surface 752 so as to reinforce the structural integrity of the contoured or convex ceiling member 75.

Figure 12:
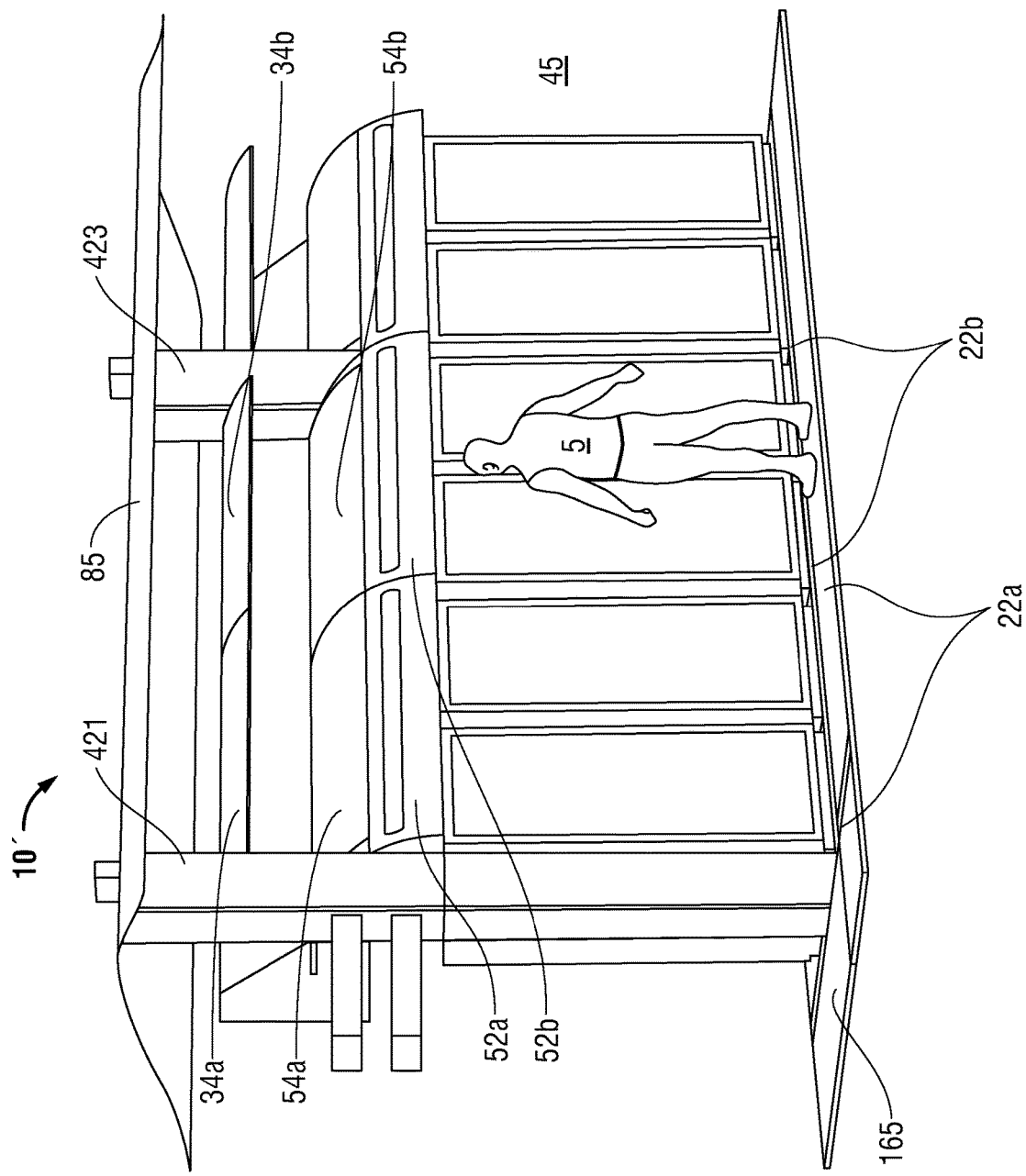
FIG. 12 illustrates an alternative embodiment of the portion of the data center subassembly 10 illustrated in FIG. 8 that includes as a ceiling a wave-like sheet-metal canopy above the hot aisle and crossing above the sets of three fans FIGS. 1-5, and crossing above the cold aisle.

FIG. 12 illustrates an alternative embodiment of the portion of the data center subassembly 10 illustrated in FIG. 8, namely a portion of a data center subassembly 10' that differs from the portion of the data center subassembly 10 illustrated in FIG. 8 by the inclusion of a wave-like sheet-metal canopy 85 above the hot aisle 25 and crossing above the sets of three fans 31a, 31b, . . . 31n, . . . , 32a, 32b, 32c, . . . , 32n and above the sets of server racks 21a, 21b, . . . , 21n and 22a, 22b, 22c, . . . , 22n described above with respect to FIGS. 1-5, and crossing above the cold aisle 45 described above with respect to FIGS. 4, 6A, 6B, 7A, 7B, 8 and 9. The wave-like canopy 85 serves as an alternative ceiling member to ceiling member 65 above the hot aisle 25 and adjacent sets of server racks 22a, 22b and the contoured or convex ceiling member 75 above the cold aisle 45.

As can be appreciated from the foregoing description of the various figures, in some embodiments, the upper air foils 34a, 34b and lower air foils 54a, 54b, are elliptical and generally parallel to each other. The ceiling member 65, which may be convex, or the planar or flat surface ceiling member 65', and the upper air foils 34a, 34b may form a nozzle to create a turbulent wake pattern 100 within the cold aisle 45 (or, in other embodiments, in the hot aisle 25).

In view of the foregoing description of the air flow distribution system 80 and the electrical enclosure assemblies 50a, 50b, those skilled in the art will recognize that, as best illustrated in FIG. 6B, the foregoing description also enables a method for distributing air flow for cooling server racks. More particularly, the method includes disposing at least one server rack, e.g., server racks 22a, 22b, at least partially defining the hot aisle 25 and the cold aisle 45 and causing air to be directed between a first air foil, e.g., lower air foils 54a, 54b, that are disposed above the one or more server racks, e.g., server racks 22a, 22b, and a second air foil, e.g., upper air foils 34a, 34b, disposed above the first air foil, e.g., lower air foils 54a, 54b, wherein the air exiting from the first air foil 54a, 54b and the second air foil 34a, 34b form turbulent wake patterns 100 in the cold aisle 45.

In one exemplary embodiment, the method may include causing the air to be directed between the ceiling member 65' that is disposed above the second air foil 34a, 34b and the second air foil 34a, 34b and between the first air foil 54a, 54a and the second air foil 34a, 34b, wherein the air exiting from the ceiling member 65', the first air foil 54a, 54b, and the second air foil 34a, 34b form turbulent wake patterns 100 as illustrated by arrows A in the cold aisle 45 partially defined by the one or more server racks 22a, 22b.

In one exemplary embodiment of the method, ceiling member 75 is configured as a convex surface 751 that interfaces with the air flowing from the hot aisle 25 to the cold aisle 45. The method may include causing the air to be directed between the ceiling member 75 configured as a convex surface 751 and the second air foil 34a, 34b and between the second air foil 34a, 34b and the first air foil 54a, 54b, wherein the air exiting from the ceiling member 75, the second air foil 34a, 34b, and the first air foil form 54a, 54b turbulent wake patterns 100 in the cold aisle 45 partially defined by the one or more server racks 22a, 22b.

In one exemplary embodiment of the method, the first air foil 54a, 54b is configured and movably coupled to cover electrical enclosure receptacle 52a or 52b (see FIGS. 10A-10E) that is configured to receive cables 6211, 6222 or a support member, e.g., cable trays 621, 622, respectively, of the cables 6211, 6222 for the sets of one or more server racks 22a, 22b. The method may include causing the air to be directed between the first air foil 54a, 54b that is configured and movably coupled to cover the electrical enclosure receptacle 52a or 52b and the second air foil 34a, 34b.

In one exemplary embodiment of the method, the first air foil 54a, 54b is further configured to rotatably move to enable access to the one or more cables 6211, 6222 or the support member, e.g., cable trays 621, 622, of the one or more cables 6211, 6222, respectively. The method may include causing the air to be directed between the first air foil 54a, 54b that is configured to rotatably move to enable access to the one or more cables 6211, 6222 or the support members, e.g., cable trays 621, 622, of the one or more cables 6211, 6222, respectively.

In one exemplary embodiment of the method, the cables 6211, 6222 includes an electrical cable, a fiber-optic cable, or a combination of an electrical cable and a fiber-optic cable. The method may include causing the air to be directed between the first air foil 54a, 54b that is configured and movably coupled to cover the electrical enclosure receptacle 52a or 52b and the second air foil 34a, 34b.

Although the foregoing disclosure describes the air flow distribution system 80 and corresponding method as utilizing the first or lower air foils 54a, 54b . . . and the second or upper air foils 34a, 34b . . . to form turbulent wake patterns 100 in the cold aisle 45 partially defined by the at least one server rack 22a, 22b . . . , or the first or lower air foils 54a, 54b . . . , the second or upper air foils 34a, 34b . . . , and the ceiling members 65' or 75 to form turbulent wake patterns 100 in the cold aisle 45 partially defined by the at least one server rack 22a, 22b . . . , or the first or lower air foils 54a, 54b . . . , the air flow distribution system 80 and corresponding method may also be effected by utilizing only the second or upper air foils 34a, 34b . . . , and the ceiling members 65' or 75 to form the turbulent wake patterns 100 in the cold aisle 45 partially defined by the at least one server rack 22a, 22b . . . , or only the second or upper air foils 34a, 34b . . . to form the turbulent wake patterns 100.

While several embodiments of the disclosure have been shown in the drawings and/or described in the specification, it is not intended that the disclosure be limited to these embodiments. It is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims set forth below.

What is claimed is:

1. An air flow distribution system for cooling server racks comprising:
   at least one server rack partially defining a hot aisle and a cold aisle;
   a first air foil disposed above the at least one server rack;
   a second air foil disposed above the first air foil; and
   an electrical enclosure receptacle configured to receive at least one cable or a support member for the at least one cable for the at least one server rack,
   wherein the first air foil and the second air foil are configured to receive air from the hot aisle, and to form turbulent wake patterns in the cold aisle partially defined by the at least one server rack, and
   wherein the first air foil is configured and movably coupled to cover the electrical enclosure receptacle.

2. The air flow distribution system according to claim 1, further comprising a ceiling member disposed above the second air foil.

3. The air flow distribution system according to claim 2, wherein the first air foil, the second air foil, and the ceiling member are configured to receive air from the hot aisle and to form turbulent wake patterns in the cold aisle partially defined by the at least one server rack.

4. The air flow distribution system according to claim 3, further comprising at least one air circulation member configured to direct air between the ceiling member and the first air foil and between the first air foil and the second air foil.

5. The air flow distribution system according to claim 2, wherein at least a portion of the ceiling member includes a convex surface that interfaces with the air flowing from the hot aisle to the cold aisle.

6. The air flow distribution system according to claim 5, wherein the ceiling member is disposed at least partially downstream of the second air foil.

7. The air flow distribution system according to claim 6, wherein the first air foil includes a surface that is convex with respect to the air flow, and the second air foil includes a first surface that is concave with respect to the air flow and a second surface that is convex with respect to the air flow.

8. The air flow distribution system according to claim 1, further comprising at least one air circulation member configured to direct air between the first air foil and the second air foil.

9. The air flow distribution system according to claim 8, wherein the at least one air circulation member includes at least one fan.

10. The air flow distribution system according to claim 1, wherein the first air foil is configured to rotatably move to enable access to the at least one cable or a support member for the at least one cable.

11. The air flow distribution system according to claim 10, wherein the cable includes an electrical cable, a fiber-optic cable, or a combination of an electrical cable and a fiber-optic cable.

12. A method for distributing air flow for cooling server racks, comprising:
   disposing at least one server rack at least partially defining a hot aisle and a cold aisle; and
   causing air to be directed between (a) a first air foil that is disposed above the at least one server rack and is configured and movably coupled to cover an electrical enclosure receptacle configured to receive at least one cable or a support member for the at least one cable, and (b) a second air foil disposed above the first air foil,
   wherein the air exiting from the first air foil and the second air foil forms turbulent wake patterns in the cold aisle at least partially defined by the at least one server rack.

13. The method for distributing air flow according to claim 12, wherein causing the air to be directed between the first air foil and the second air foil includes causing the air to be directed between a ceiling member disposed above the second air foil and the second air foil and between the first air foil and the second air foil, and
   wherein the air exiting from the ceiling member, the first air foil, and the second air foil forms turbulent wake patterns in the cold aisle partially defined by the at least one server rack.

14. The method for distributing air flow according to claim 13, wherein the ceiling member is configured as a convex surface that interfaces with the air flowing from the hot aisle to the cold aisle,
   wherein the method further comprises causing the air to be directed between the ceiling member configured as a convex surface and the second air foil and between the second air foil and the first air foil, and
   wherein the air exiting from the ceiling member configured as a convex surface, the second air foil, and the first air foil forms turbulent wake patterns in the cold aisle partially defined by the at least one server rack.

15. The method for distributing air flow according to claim 12, wherein the first air foil is further configured to rotatably move to enable access to the at least one cable or a support member for the at least one cable, and
   wherein the method further comprises causing the air to be directed between the first air foil that is configured to rotatably move to enable access to the at least one cable or a support member for the at least one cable and the second air foil.

16. The method for distributing air flow according to claim 12, wherein the cable received by the electrical enclosure receptacle includes an electrical cable, a fiber-optic cable, or a combination of an electrical cable and a fiber-optic cable.

17. An electrical enclosure assembly for at least one server rack at least partially defining a hot aisle and a cold aisle, comprising:
   an electrical enclosure receptacle configured to receive at least one cable or a support member of the at least one cable;
   a first air foil configured to cover the electrical enclosure receptacle; and
   a second air foil disposed above the first air foil,
   wherein the first air foil and the second air foil promote air flowing between the hot aisle and the cold aisle, and
   wherein the first air foil is configured to rotatably move to enable access to the at least one cable or a support member of the at least one cable.

18. The electrical enclosure assembly according to claim 17,
   wherein the first air foil and the second air foil are configured to form turbulent wake patterns in the air flowing into the cold aisle.

19. The electrical enclosure assembly according to claim 17, further comprising an air circulation member configured to facilitate flow of air between the first air foil and the second air foil.

20. The electrical enclosure assembly according to claim 17, further comprising a lighting enclosure assembly configured to receive at least one lighting member configured and disposed to project light, wherein at least a portion of the lighting enclosure assembly forms an extension of the air foil.

21. The electrical enclosure assembly according to claim 20, further comprising at least one lighting member disposed in the lighting enclosure assembly.

* * * * *